United States Patent [19]
Zenke

[11] Patent Number: 5,187,557
[45] Date of Patent: Feb. 16, 1993

[54] SEMICONDUCTOR CAPACITOR WITH A METAL NITRIDE FILM AND METAL OXIDE DIELECTRIC

[75] Inventor: Masanobu Zenke, Tokyo, Japan
[73] Assignee: NEC Corporation, Tokyo, Japan
[21] Appl. No.: 613,070
[22] Filed: Nov. 15, 1990
[30] Foreign Application Priority Data
 Nov. 15, 1989 [JP] Japan .................................. 1-298017
[51] Int. Cl.⁵ ..................... H01L 27/02; H01L 23/48; H01L 29/68; H01G 4/06
[52] U.S. Cl. ..................................... 257/310; 361/313
[58] Field of Search ........................ 357/23.6, 51, 71; 361/313

[56] References Cited
FOREIGN PATENT DOCUMENTS
1-222469 9/1989 Japan .................................. 357/23.6

OTHER PUBLICATIONS
Shinriki et al., "Oxidized $Ta_2O_5/Si_3N_4$ Dielectric Films for Ultimate-STC dRams", IEDM Tech. Digest, 1986, pp. 684–687.
Shinriki et al., "$Ta_2O_5$ Capacitor Technology Compatible with Advanced VLSI Process", Technical Digest of 1988 Symposium on VLSI Technology (1988).

Primary Examiner—Rolf Hille
Assistant Examiner—Robert Limanek
Attorney, Agent, or Firm—Burns, Doane, Swecker & Mathis

[57] ABSTRACT

A semiconductor device having a capacitor part which is composed of the first electrode including a first titanium nitride film, a dielectric layer and a second electrode including a second titanium nitride film, the titanium nitride film being sandwiched between the dielectric layer and the first and second electrodes, whereby it is possible to obtain a capacitor having a high capacitance value and which can inhibit the reaction between the dielectric layer and the electrode and which does not result in an increase in a leakage current of the dielectric layer and a deterioration of isolation voltage.

15 Claims, 3 Drawing Sheets

SEMICONDUCTOR CAPACITOR WITH A METAL NITRIDE FILM AND METAL OXIDE DIELECTRIC

BACKGROUND OF THE INVENTION

1. Field of the Invention

This invention relates to a semiconductor device and particularly to a structure of a capacitor part using a metal oxide film.

2. Description of the Prior Art

In semiconductor devices, such as a dynamic random access memory, which is provided with a capacitor part as a structural element, integration density is yearly increased. With the increase of the integration density, the area which the capacitor occupies becomes smaller and a capacitor insulating film having a high specific dielectric constant has been needed. For this capacitor insulating film having the high specific dielectric constant, to use a film of a dielectric material, such as $Ta_2O_5$, $TiO_2$, $Nb_2O_5$, $HfO_2$, $ZrO_2$ or the like, has been tried.

As the structure using the above dielectric film, there is a structure in which the dielectric film, for example the $Ta_2O_5$ film, is formed on the first electrode of a silicon substrate, a polycrystal silicon or the like. Further the second electrode of a polycrystal silicon or the like is formed on the $Ta_2O_5$ film thereon. In this structure, however, there are several defects that, when the $Ta_2O_5$ film is formed, the silicon substrate or the like of the first electrode is oxidized to form a silicon oxide film, whereby the value of capacitance is reduced and in I-V characteristics are dependent on a polarity of a gate voltage. In addition, in a heat treatment after forming the second electrode, there is a defect that the polycrystal silicon of the second electrode reacts with $Ta_2O_5$ and thus a leakage current is increased.

In the past, in order to obviate the above first defects, there has been proposed a method wherein a thin silicon nitride film is formed on a silicon substrate or polycrystal silicon and thereafter a $Ta_2O_5$ film is formed thereon (e.g. H. Shinriki et al., IDEM Tech. Dig. P684, 1986). Also, in order to obviate the above second defect, there has been proposed a structure wherein a silicon nitride film or a silicon oxide film is sandwiched between a $Ta_2O_5$ film and the second electrode (e.g. H. Shinriki et al., Tech. Res. Report of Electron Information Communication Society, SDM88-44, P25 (1988)).

In the prior capacitor structure as mentioned above, however, the silicon nitride film is sandwiched between the $Ta_2O_5$ film and the first electrode or the silicon nitride film or silicon oxide film is sandwiched between the $Ta_2O_5$ film and the second electrode. Thus, there is another defect that the capacitance value is reduced as compared with that of a single layer of the $Ta_2O_5$ film.

SUMMARY OF THE INVENTION

It is an object of the invention to provide an improved semiconductor device wherein a capacitor part is composed of the first electrode of a semiconductor substrate, a polycrystal silicon or the like, the first metal nitride film, a capacitor film comprising a metal oxide film, the second metal nitride film and the second electrode.

In the capacitor part according to this invention, the metal nitride film which is chemically stable and has a lower resistivity is sandwiched between the first electrode and the capacitor film comprising the metal oxide film and further between the capacitor film and the second electrode. In contrast, the prior capacitor part as mentioned above comprises the first electrode of the silicon substrate, polycrystal silicon, silicide, or high melting metal, or the like, the capacitor film comprising the metal oxide film and the second electrode.

The above object is accomplished by providing a semiconductor device wherein a capacitor part is composed of the first electrode including the first metal nitride film, a dielectric layer including a metal oxide film and the second electrode including the second metal nitride film formed on said dielectric layer.

BRIEF DESCRIPTION OF THE DRAWINGS

By way of example of the many features and advantages of the invention, an illustrative embodiment in the semiconductor device is described below and shown in the accompanying drawings, in which.

DETAILED DESCRIPTION OF THE PREFERRED EMBODIMENT

The first electrode in this invention may be composed of the first metal nitride film alone or a composite layer comprising a semiconductor substrate and the first metal nitride film or a layer of a conductor selected from polycrystal silicon, silicide, a high melting metal or the like and the first metal nitride film.

The second electrode in this invention may be composed of the second metal nitride film alone or a composite layer comprising the second metal nitride film and a layer of a conductor selected from polycrystal silicon, silicide, a high melting metal or the like.

The above first and second metal nitride films comprise a film of a nitride of titanium, tungsten, tantalum, molybdenum, niobium, zirconium, palladium, nickel, hafnium, vanadium, chromium or platinum or a combination thereof.

Next, this invention will be described with reference to the accompanying drawings.

Figure 1:
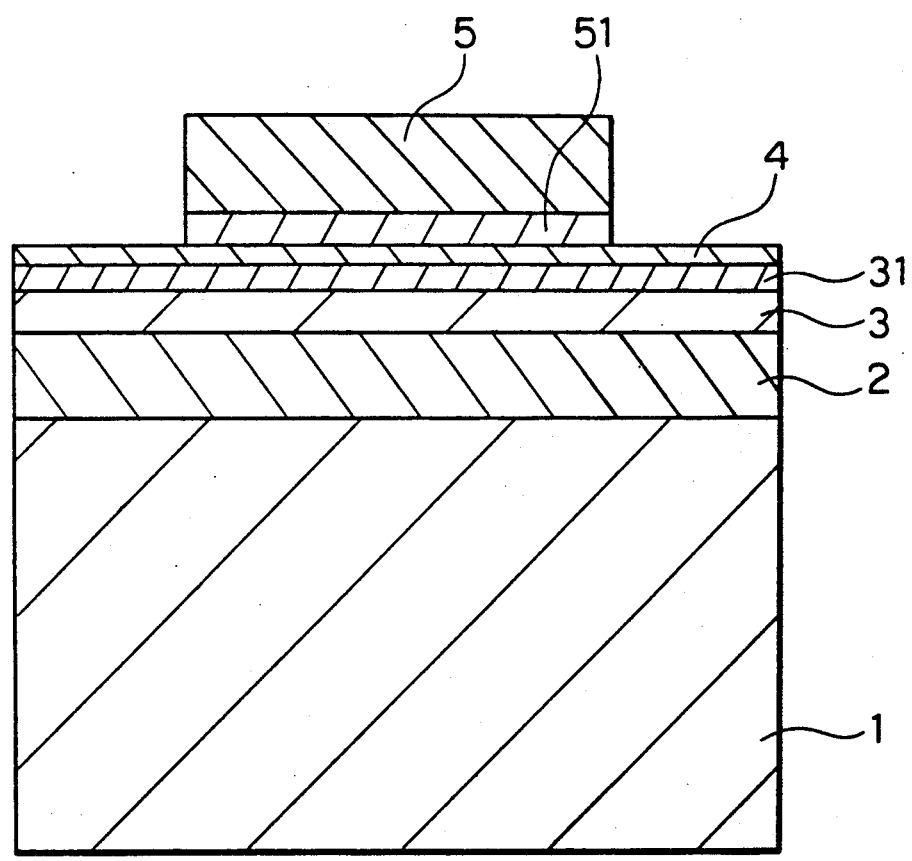
FIG. 1 shows a typical sectional view of the first embodiment of this invention.

FIG. 1 shows a typical sectional view of the first embodiment of this invention. In FIG. 1, a reference number 1 indicates a silicon substrate, 2:a $SiO_2$ film, 3:a polycrystal silicon film of a conductor layer, 31:a titanium nitride film of the first metal nitride film, 4:a $Ta_2O_5$ film of a capacitor film, 5:a polycrystal silicon film of a conductor layer and 51:a titanium nitride film of the second metal nitride film, the lower electrode of the first electrode comprising two layers of the polycrystal silicon film of 3 and the titanium nitride film of 31 and the upper electrode of the second electrode comprising two layers of the titanium nitride film of 51 and the polycrystal silicon film of 5.

The capacitor of the first embodiment of this invention can be manufactured as follows.

First, the $SiO_2$ film 2 is formed on the silicon substrate by an oxidation treatment of the like. Then, the polycrystal silicon film 3 of the conductor layer is formed thereon by a CVD or sputtering method or the like. The titanium nitride film 31 is directly formed on this polycrystal silicon film 3 by the sputtering or CVD method or the like, or a titanium film is formed on the polycrystal silicon film 3 by the sputtering method and then the titanium nitride film 31 is formed thereon by a heat treatment such as a lamp annealing or the like. The titanium nitride film is about 300-2000 Å thick. Then, the Ta$_2$O$_5$ film 4 is formed on the titanium nitride film 31 by the reactive sputtering method, CVD method or the like, or a Ta film is formed on the titanium nitride film 31 by the sputtering method and the Ta$_2$O$_5$ film 4 is formed thereon by a thermal oxidation. The Ta$_2$O$_5$ film is about 50-300 Å thick. In addition, the titanium nitride film 51 is formed on the Ta$_2$O$_5$ film 4. A method for forming the titanium nitride film and the thickness thereof may be the same as in the titanium nitride film 31 as mentioned above. Finally, the polycrystal silicon film 5 of the conductor layer is formed thereon with the thickness of about 1000-6000 Å.

Figure 2:
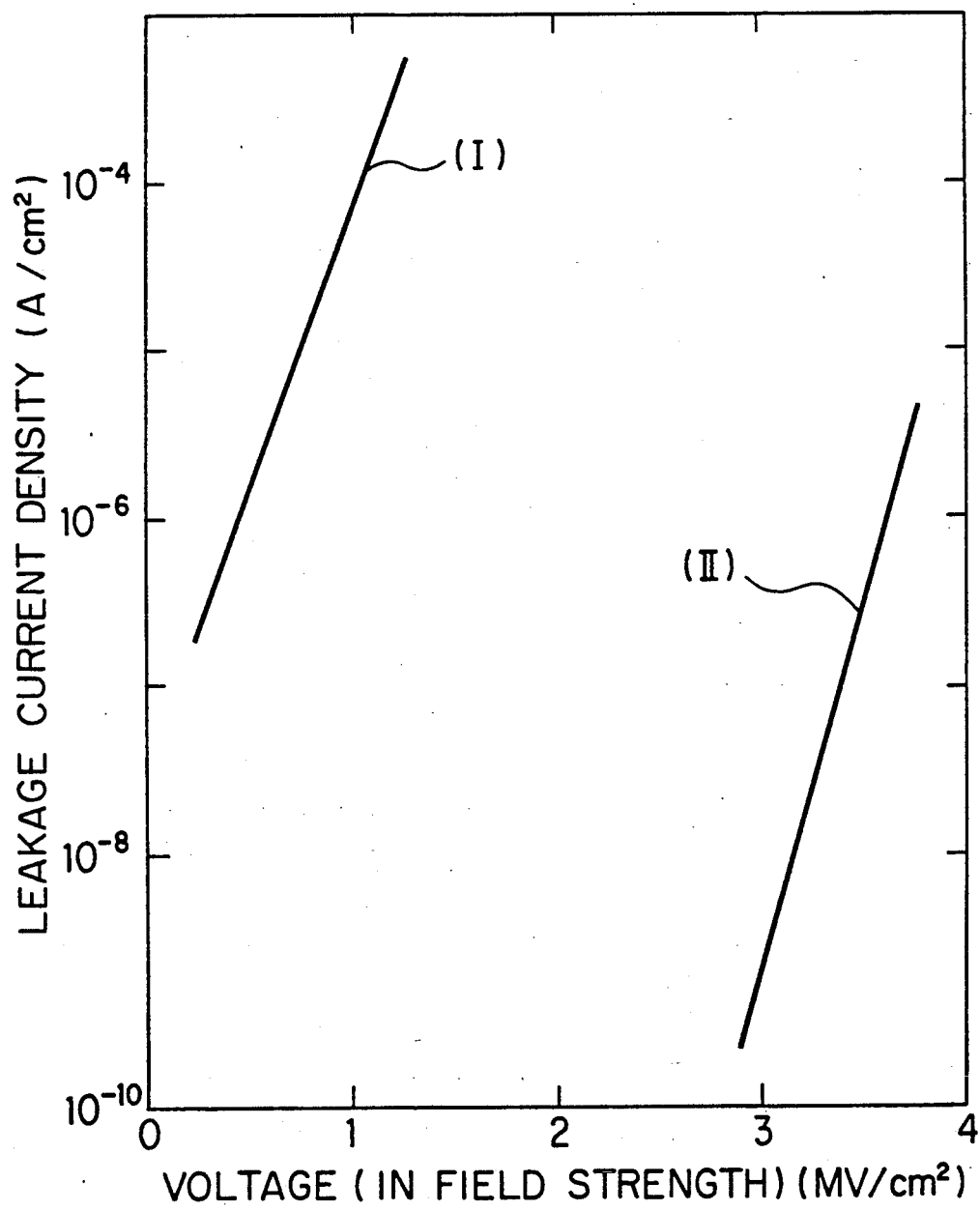
FIG. 2 shows leakage current characteristic curves of capacitor films in this invention and the prior art, with an ordinate axis being current density of leakage current and an abscissa axis being field strength applied to the capacitor film.

Next, in FIG. 2 there is shown a leakage current characteristic of a capacitor after forming an electrode in the capacitor of the first embodiment of this invention which is followed by a heat treatment of 900° C. (I). In FIG. 2, there is also shown the leakage current characteristic of the prior capacitor structure comprising the polycrystal silicon, Ta$_2$O$_5$ and polycrystal silicon (II). In FIG. 2, an ordinate axis indicates a leakage current density and an abscissa axis indicates voltage (in field strength) applied to the Ta$_2$O$_5$ film of the capacitor film. As in the first embodiment of this invention, the titanium nitride films 31 and 51 are interposed between the Ta$_2$O$_5$ film 4 and the polycrystal silicon films 3 and 5, whereby the leakage current can be sharply reduced more than a number of several order.

This is due to the fact that a chemically stable titanium nitride effectively inhibits the following reaction:

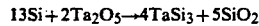

$$13Si + 2Ta_2O_5 \rightarrow 4TaSi_3 + 5SiO_2$$

which takes place between the polycrystal silicon layer and the Ta$_2$O$_5$ film of the capacitor film. Thus, it is possible to restrain occurence of pin holes and weak spots which will be caused in the capacitor film and to control an increase in the leakage current of the capacitor film, a deterioration in an isolation voltage and a reduction in reliability.

In addition, even if the treatment is carried out at 900° C. after forming the electrode, the capacitance value in the first embodiment does not change and has a good stability to the heat treatment.

As mentioned above, according to this invention, it is possible to provide the capacitor structure having a high capacitance value in which the best use of the Ta$_2$O$_5$ film having a high dielectric coefficient is made, and having a good stability of electric characteristic to the heat treatment after forming the second electrode.

Figure 3:
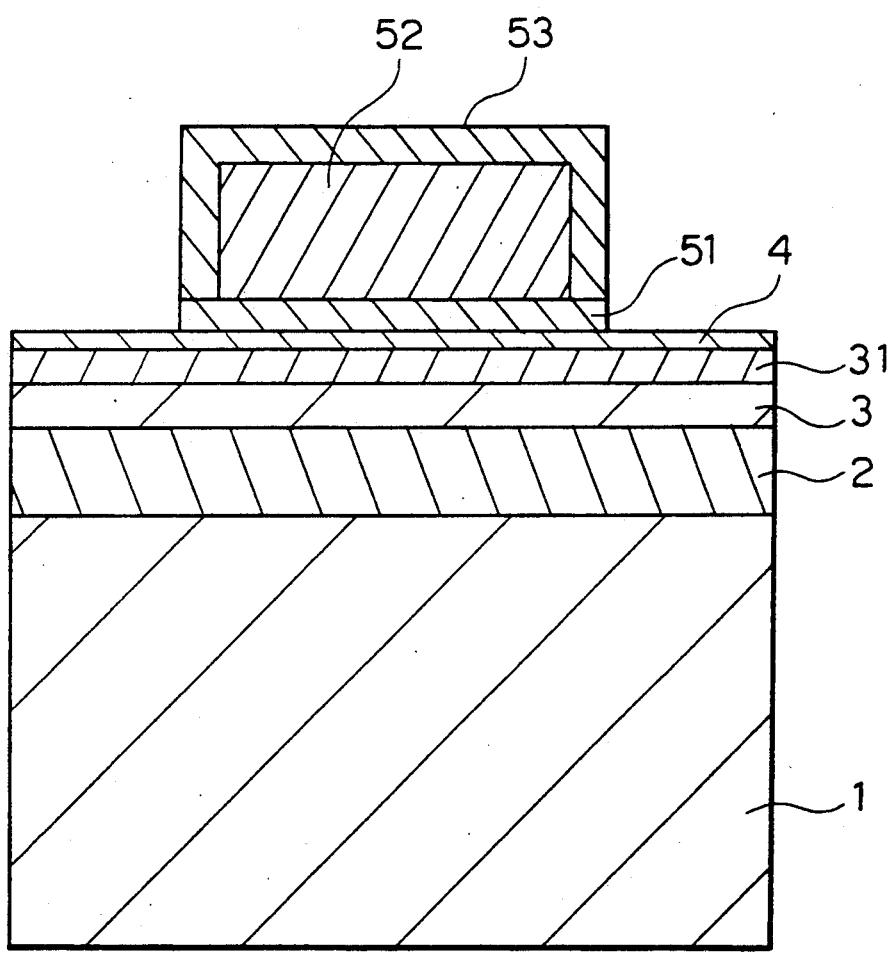
FIG. 3 shows a typical sectional view of the second embodiment of this invention.

FIG. 3 shows a typical sectional view of the second embodiment of this invention. In FIG. 3, a reference number 52 indicates a titanium film of a conductor layer, 53 indicates a titanium nitride film which surrounds the titanium film 52 except for the portion thereof which is adjacent to the titanium nitride film 51 and the other reference numbers are the same as in FIG. 1.

The capacitor of the above second embodiment is manufactured as follows.

First, according to the manner similar to that of the first embodiment, the SiO$_2$ film 2 is formed on the silicon substrate 1 by a thermal oxidation or the like. Then, the polycrystal silicon 3 of the conductor layer is formed thereon by the CVD or sputtering method or the like. The titanium nitride film 31 is directly formed on this polycrystal silicon 3 by the sputtering or CVD method or the like, or the titanium film is formed on the polycrystal film 3 by the sputtering method or the like and then the titanium nitride film 31 is formed thereon by the heat treatment such as the lamp annealing or the like. The thickness of the titanium nitride film is in a range of about 300-2000 Å. Then, the Ta$_2$O$_5$ film 4 is formed on the titanium nitride film 31 by the reactive sputtering or CVD method or the like, or the Ta film is formed on the titanium nitride film 31 by the sputtering method or the like and then the Ta$_2$O$_5$ film is formed thereon by the thermal oxidation. The thickness of the Ta$_2$O$_5$ film is in a range of about 50-300 Å. In addition, the titanium nitride film 51 is formed on the Ta$_2$O$_5$ film 4. A method for forming the titanium nitride film and the thickness thereof may be almost the same as in the above titanium nitride film 31. Thereafter, the titanium film of about 1000-6000 Å is formed thereon by the sputtering or CVD method or the like. The titanium film is etched into an electrode pattern by using a photo resist (PR). After the PR was removed, the titanium film 52 is subjected to the heat treatment such as the lamp annealing or the like to form the titanium nitride film 53 of about 300-2000 Å around the titanium film 52. Alternatively, the titanium nitride film 53 may be formed around the titanium film 52 by the sputtering method or the like.

In the second embodiment, the second electrode comprises the titanium film 52 and the titanium nitride films 51 and 53. By enclosing the titanium film 52 with the titanium nitride films 51 and 53, it is possible to inhibit a reaction of the titanium film 52 with the Ta$_2$O$_5$ film 4 of the capacitor film and also to inhibit a reaction of the titanium film 52 with the interlayer film. As a result, even if the heat treatment is carried out after forming the first electrode in the capacitor part and even if the heat treatment is carried out after forming the second electrode in the capacitor part, it is possible to form the capacitor which does not result in an increase of the leakage current in the capacitor film and the deterioration of the isolation voltage.

In the second embodiment, the metal nitride film 51 between the titanium film 52 and the Ta$_2$O$_5$ film 4 is the same as the metal nitride film 53 surrounding the titanium film 52, both of the metal nitride films being the titanium nitride film. However, even if the metal nitride films 51 and 53 are composed of different metal nitride films, for example, titanium nitride film and tungsten nitride film, respectively, and vice versa, the effect caused by such a combination is the same as that of this embodiment.

A combination of the metal nitride film and the conductor layer 3 can be freely made. For example, it is possible to combine the tantalum nitride film with the polycrystal silicon layer, the titanium nitride film with the tungsten layer or the like. The effect caused by these combinations is the same as that of this embodiment.

Moreover, in the first and second embodiments of this invention, the first electrode comprises the polycrystal silicon layer and the titanium nitride film. However, even if there is used the first electrode comprising the silicon substrate or the high melting metal and the metal nitride film, the effect is the same as that in the above electrode.

In the first embodiment, the second electrode comprises the titanium nitride film and the polycrystal silicon layer. However, even if the second electrode comprising the other metal nitride film and silicide or the high melting metal or the like is used instead of the above electrode, the effect is the same as that in the first embodiment.

Even if a film comprising a metal oxide other than $Ta_2O_5$ or a metal oxide in which silicon or the other metal is included, or a film of a multilayer structure comprising the silicon oxide film or silicon nitride film and the metal oxide is used as the capacitor film, the effect is the same as in the above embodiments.

A combination of the metal nitride in the first and second electrodes and the conductor can be freely made. However, the effect is the same as that in this embodiment.

From the foregoing, it will be appreciated that, according to this invention, the metal nitride film which is chemically stable and has a lower resistivity is sandwiched between the upper and lower electrodes of the capacitor part of the capacitor film as described herein, whereby it is possible to obtain the improved capacitor having a high capacitance value in which the best use of the metal oxide film having a high dielectric coefficient is made, and which inhibits the reaction between the capacitor film and the electrode which is caused by the heat treatment after forming the upper electrode and which has not an increase of the leakage current in the capacitor film and a deterioration of the isolation voltage.

What is claimed is:

1. A semiconductor device comprising a capacitor part including:
    a first electrode including a first metal nitride film;
    a dielectric layer, formed on said first metal nitride film, including a metal oxide film; and
    a second electrode completely surrounded by a second metal nitride film and formed on said dielectric layer.

2. A semiconductor device as defined in claim 1, wherein said first electrode consists essentially of said first metal nitride film.

3. A semiconductor device as defined in claim 1, wherein said second electrode consists essentially of said second metal nitride film.

4. A semiconductor device as defined in claim 1, wherein said first and second metal nitride films comprise a film of titanium nitride, tungsten nitride, tantalum nitride, molybdenum nitride, niobium nitride, zirconium nitride, palladium nitride, nickel nitride, hafnium nitride, vanadium nitride, chromium nitride, or platinum nitride, or a combination thereof.

5. A semiconductor device as defined in claim 1, wherein said metal oxide film is about 50–300 Å thick.

6. A semiconductor device as defined in claim 1, wherein said first and second metal nitride films are about 300–2000 Å thick.

7. A semiconductor device as defined in claims 2, wherein said conductor layer is about 1000–6000 Å thick.

8. A semiconductor device comprising a silicon substrate, a $SiO_2$ film, a first electrode, a $Ta_2O_5$ film and a second electrode, said first electrode including a polycrystal silicon layer and a first titanium nitride film, said second electrode including a titanium film and a second titanium nitride film which completely surrounds the titanium film.

9. A semiconductor device as defined in claim 1, wherein said first electrode consists essentially of a composite layer of a semiconductor substrate and said first metal nitride film.

10. A semiconductor device as defined in claim 1, wherein said first electrode consists essentially of a composite layer of a conductor selected from polycrystal silicon, silicide and a high melting metal, and said first metal nitride film.

11. A semiconductor device as defined in claim 1, wherein said second electrode consists essentially of a layer of said second metal nitride film and a layer of a conductor selected from polycrystal silicon, silicide, and a high melting metal.

12. A semiconductor device as defined in claim 10, wherein said conductor layer is about 1000–6000 Å thick.

13. A semiconductor device as defined in claim 10, wherein said conductor layer is about 1000–6000 Å thick.

14. A semiconductor device as defined in claim 11, wherein said conductor layer is about 1000–6000 Å thick.

15. A semiconductor device as defined in claim 3, wherein said conductor layer is about 1000–6000 Å thick.

* * * * *